United States Patent [19]

Oshida et al.

[11] Patent Number: 4,744,666
[45] Date of Patent: May 17, 1988

[54] ALIGNMENT DETECTION OPTICAL SYSTEM OF PROJECTION TYPE ALIGNER

[75] Inventors: Yoshitada Oshida, Fujisawa; Naoto Nakashima; Toshihiko Nakata, both of Yokohama, all of Japan

[73] Assignee: Hitachi, Ltd., Tokyo, Japan

[21] Appl. No.: 886,044

[22] Filed: Jul. 16, 1986

[30] Foreign Application Priority Data

Jul. 19, 1985 [JP] Japan .................. 60-158122

[51] Int. Cl.⁴ .................................. G01B 11/27
[52] U.S. Cl. .................................... 356/401
[58] Field of Search ....................... 356/399–401; 250/458, 557, 561, 491

[56] References Cited

U.S. PATENT DOCUMENTS 4,362,389 12/1982 Koizumi et al. ............. 356/401
4,641,035 2/1987 Suzuki et al. ............. 356/400 X Primary Examiner—Eugene R. LaRoche
Assistant Examiner—David Mis
Attorney, Agent, or Firm—Antonelli, Terry & Wands

[57] ABSTRACT

In an alignment detection optical system designed to observe an alignment pattern of a mask and an image of an alignment pattern of a wafer formed on the alignment pattern of the mask by a projection lens in a projection type aligner, there is provided a spatial filter designed to select only the reflected light having a desired reflection angle from the light reflected by the alignment pattern composed of steps formed on a surface of the wafer.

5 Claims, 8 Drawing Sheets

ALIGNMENT PATTERN    2 WAFER

ALIGNMENT DETECTION OPTICAL SYSTEM OF PROJECTION TYPE ALIGNER

BACKGROUND OF THE INVENTION

The present invention relates to a projection type aligner, especially to an alignment detection optical system suited for a reduction projection aligner used for the manufacture of the micropattern LSIs.

The manufacturing processes of the LSI need to include a process for accurately superimposing and printing the pattern of another circuit on the pattern of the circuit which has already been formed on a substrate such as a wafer of the semiconductor. The device for printing such circuit pattern is the exposure system. The pattern to be printed is formed on a mask, and the action for aligning a wafer pattern to a mask pattern is called the alignment. In order to meet the demand for higher integration and further reduction of the LSI pattern, the reduction projection aligner is used, and the TTL (Through The Lens) alignment system has come to be used for the alignment between the alignment pattern of the mask and the alignment pattern image of the wafer and the subsequent exposure.

As the alignment detection optical system for observing the alignment pattern of the mask and the alignment pattern image of the wafer at the time of the above-mentioned TTL alignment, there is already an optical system harmless to the circuit pattern to be exposed, adaptable to the TTL alignment and adjustable to the variation of the chip size as is announced in Japanese Patent Application Laid-Open No. 142612/1982.

According to said optical system, the alignment pattern image of the wafer is projected on an image sensor through a conventional projection optical system, so that the pattern signal is dependent on the characteristic of the reduction lens. In designing the reduction lens, however, the first priority is given to its resolution for obtaining the desired exposure and printing effects, therefore the numerical aperture (NA) of the lens is relatively large. It is a characteristic of the lens that the image of the alignment pattern which is formed as a step on the surface of the wafer and projected on the mask has a weak contrast. Thus, the alignment pattern signal obtained by said optical system has a weak contrast, the drawback to the improvement in the alignment.

SUMMARY OF THE INVENTION

The main objective of the present invention is to provide an alignment detection optical system which enables us to obtain a high-contrast alignment pattern signal suited for the detection of the position of the alignment pattern, regardless of the characteristic of the above-mentioned reduction lens.

According to the present invention, in the alignment detection optical system designed for observing the alignment pattern of the mask and the alignment pattern image of the wafer formed on the alignment pattern of the mask provided as the means for aligning the positions of the mask and the wafer in the projection type aligner, a spatial filter is disposed at a position which is out of conjugate relation to said alignment pattern of the wafer between the image of the above-mentioned alignment pattern of the wafer and the image sensor. In the preferred embodiment of the present invention, said spatial filter is disposed at the Fourier transformation plane of the image of said alignment pattern of the wafer or a position where the entrance pupils of the reduction lens is projected through said alignment detection optical system or a position near these positions.

The spatial filter has such transmittivity as varies in the lateral direction of said alignment pattern of the wafer and remains constant in the longitudinal direction of the same. Thus, it is possible to accentuate and detect the alignment pattern consisting of the step on the surface of the wafer by selecting the reflected ray from the surface of the wafer corresponding to its angle and making the reflected ray to be imaged on the image sensor; however, according to the present invention, the characteristic of the reduction projection lens is uncontrollable, so that the above-mentioned objective can be accomplished by providing a spatial filter for selecting the angle of the reflected ray in the alignment detection optical system designed for introducing the image of the alignment pattern of the mask formed on the the mask into the image sensor.

BRIEF DESCRIPTION OF THE DRAWINGS

FIGS. 12A and 12B show other embodiments of the present invention, of which

DETAILED DESCRIPTION OF THE PREFERRED EMBODIMENTS

Figure 1:
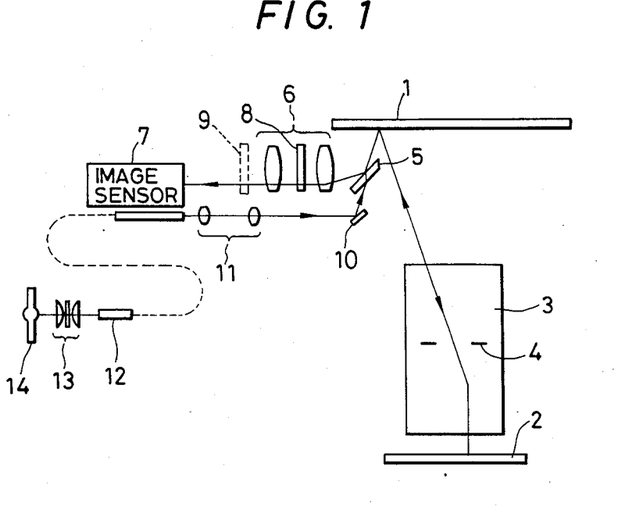
FIG. 1 is a view of the optical system arrangement showing the basic composition of the alignment detection optical system of the projection type aligner applied to the first embodiment of the present invention.

FIG. 1 is a disassembled view of the optical system arrangement showing the alignment detection optical system of the projection type aligner used in the first embodiment of the present invention wherein the circuit pattern of a mask 1 is reduced by a reduction projection lens 3, imaged on a wafer 2 and printed on the wafer. The light of g line is mainly used as the exposure light.

Next, the explanation will be made as to a alignment detection optical system designed for detecting the image of the alignment pattern of a wafer 2 formed through a reduction projection lens 3 and the alignment pattern of the mask. Under a mask 1, there are an alignment detection optical system consisting of a half mirror 5, an objective lens 6, an image sensor 7, a spatial filter 8 or a spatial filter 9 and an illumination system of the alignment pattern detection system consisting of an optical fiber 12, an illumination lens 11 and a mirror 10 which are combined into an integrated system and disposed in parallel to the mask 1 so that said integrated system can move laterally along the direction of the surface of the paper shown in FIG. 1. The objective lens 6 has an aperture which is large enough to permit the detected light to form an incident angle by moving the whole detection system, and the illumination light can be deflected in various directions by oscillating a mirror 10.

The image of the alignment pattern of the wafer 2 by the reduction projection lens 3 is formed within a plane at the position where the alignment pattern of the mask 1 is located. Furthermore, the objective lens 6 is disposed so that its focal plane coincides with the above-mentioned plane, and the image of the alignment pattern of the wafer 2 and the alignment pattern of the mask 1 can be enlarged and projected on an image sensor 7 of a solid state image sensor such as a charge coupled device. Moreover, a beam from a light source 14 which is collected through a collection lens 13 and supplied passing an optical fiber 12 and an illumination lens 11 is reflected by the surface (lower surface) of the pattern of the mask 1 through a half mirror 10 and a half mirror 5, enters into an entrance pupils 4 of a reduction projection lens 3 and illuminates the alignment pattern on the wafer 2.

Through the system described above, the patterns of the wafer 2 and the mask 1 which are illuminated by a beam from the optical fiber 12 are enlarged and projected on the image sensor 7 through the objective lens 6 and then detected.

Next, the action of a spatial filter 8 or 9 will be explained.

Figure 2A:
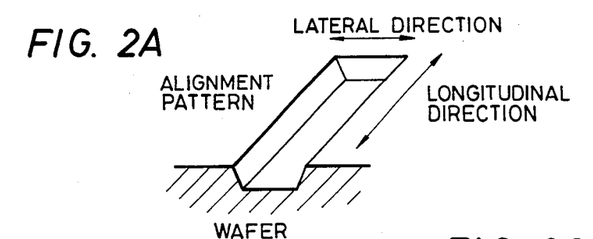
FIG. 2A is a cross-sectional view of an example of the alignment pattern of the wafer.
Figure 2B:
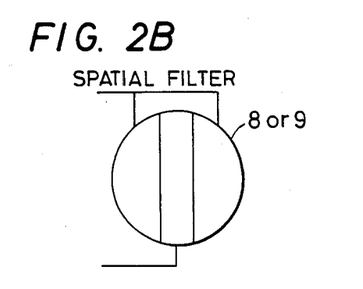
FIGS. 2B, 2D and 2F are the front views showing the three different conditions of the spatial filter used in the optical system relating to the present invention.
Figure 2C:
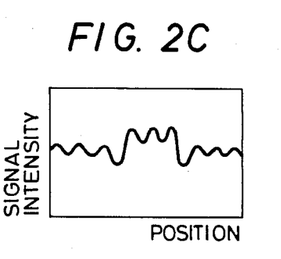
FIGS. 2C, 2E and 2G show the pattern signals at the conditions of the spatial filter described respectively in FIGS. 2B, 2D and 2F.
Figure 2D:
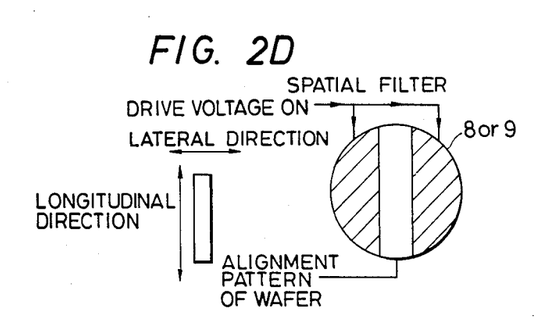
Figure 2E:
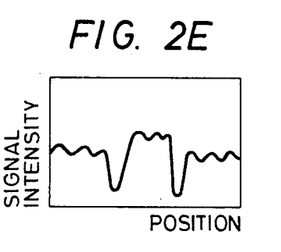
Figure 2F:
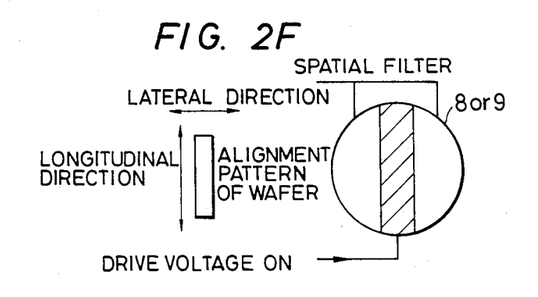
Figure 2G:
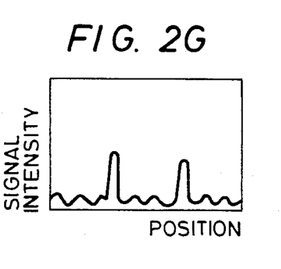

The aperture of the objective lens 6 is large enough, so that all the portion of the diffraction ray from the alignment pattern of the wafer 2 which have entered into the reduction projection lens 3 reaches the image sensor 7. It is necessary for the reduction projection lens 3 to have a large aperture whose numerical aperture NA is more than 0.28 in order to secure the desired resolution of the pattern. On the other hand, however, the contrast of the image of the alignment pattern falls, since a major portion of the diffraction ray from the step of the alignment pattern as is shown in FIG. 2A enters. Especially, where the surface of the wafer is rough, the noise component to the pattern signal increases due to the diffraction of the ray caused by the rough surface itself. When the spatial filter is not used, that is, when the spatial filter 8 or 9 is totally transparent as shown in FIG. 2B, the pattern signal of the alignment pattern is absorbed by the noise component as shown in FIG. 2C, and it becomes difficult to detect said pattern signal. Thus, when the spatial filter 8 or 9 is designed to shield the lateral outside of the alignment pattern as shown in FIG. 2D, a large component of the diffraction angle can be removed, so that, as shown in FIG. 2E, the pattern signal of the step of the alignment pattern falls, and the signal-to-noise ratio of the pattern signal can be improved. On the other hand, the small component of the diffraction angle can be removed by using the spatial filter which is capable of shielding the longitudinal central portion of the alignment patter as shown in FIG. 2F, and as a result, the step of the alignment pattern can be accentuated for detection as shown in FIG. 2G. The spatial filter 8 or 9 has such transmittivity as varies in the lateral direction of the alignment pattern and remains constant in the longitudinal direction, since it will not vary at all in the longitudinal direction as shown in FIGS. 2D and 2F. Furthermore, the spatial filter 8 or 9 is a liquid crystal filter wherein the part to which the drive voltage is applied will become opaque, whereas the part which is free from the drive voltage will remain transparent.

As explained in the above, the signal-to-noise ratio of the pattern signal can be improved by inserting the spatial filter in the alignment detection optical system of the reduction projection type aligner, and the alignment accuracy can also be improved as a result.

It is desirable for the spatial filter to be inserted in the Fourier transformation plane indicated by 8 or in the conjugate plane with the entrance pupil 4 of the reduction lens 3 indicated by 9 in FIG. 1, but almost the equal effect to the above-mentioned case can be obtained even when the spatial filter is disposed within about 30% of the object image distance of the object lens 6. The spatial filter may be either one consisting of a glass substrate and an opaque film such as the chromium film deposited on the former by the vacuum evaporation method or one consisting of the liquid crystal whose transmittivity is locally controllable from outside as is illustrated in FIGS. 2B, 2D and 2F. Furthermore, the spatial filter best suited for the alignment pattern of the wafer may be selected from a plural number of spatial filters.

Figure 3:
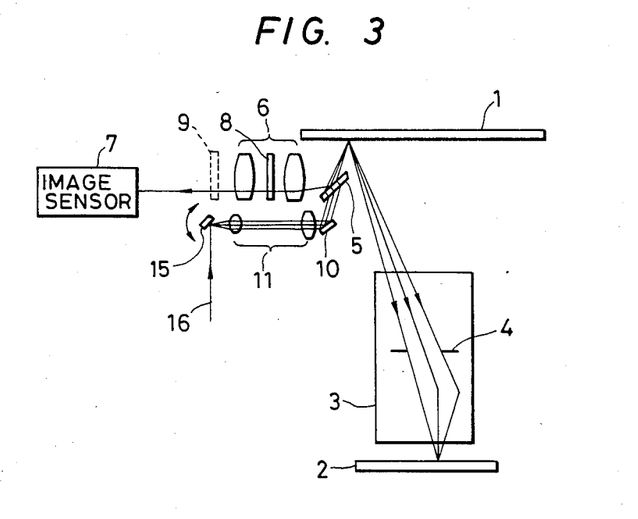
FIG. 3 is a view of arrangement showing the basic composition of the alignment detection optical system of the projection type aligner applied to the second embodiment of the present invention.

On the other hand, as for the illumination light used for the detection, in the case of the monochromatic ray, a wide range of ray can be used. For example, the light of g line or the laser beam having a similar wavelength can be used. In such case, the pattern of the mask and that of the surface of the pattern of the wafer can be used for both the alignment pattern of the mask and the alignment pattern of the wafer. Besides, the rays such as the He-Ne laser and the Ar laser whose wavelengths differ from that of the light of g line can also be used. In such case, it is necessary to correct the chrominance aberration of the reduction projection lens by using the pattern which enables the formation of the spatial image such as the Fresnel pattern for at least one of the alignment pattern of the mask and the alignment pattern of the wafer FIG. 3 shows the arrangement of the basic composition of the alignment detection optical system of the projection type aligner used in the second embodiment of the present invention. As shown in this figure, the optical system uses the Ar laser beam having the wavelength of 514.5 nm or 488 nm as an illumination light 16 of the detection system, and said the optical system consists of an illumination system comprising a galvanomirror 15 and an illumination lens 11 and a detection system similar to one described in the preceding section.

In the following, the illumination system will be explained in more details. In said illumination system, the image of the alignment pattern of the wafer 2 by the reduction projection lens 3 and the galvanomirror 15 are disposed so as to have a conjugate relation to the illumination lens 11. As a result, the incident angle of the illumination light can be oscillated by oscillating the galvanomirror 15 while keeping the illumination position on the surface of the wafer 2. The illumination system is so designed that the illumination light is collected at the focal plane of the incident side of the reduction projection lens 3 through the illumination lens 11, and the illumination light enters as a beam almost parallel to the surface of the wafer 2. For the alignment pattern of the wafer 2, the line patterns arranged radially to the exposure range are used. (There is a detailed description of the line patterns arranged radially in the U.S. Pat. No. 4,362,389.)

The effect of the illumination light defined for this embodiment will be explained by FIGS. 4A through 4E. The illumination light defined for this embodiment has a small numerical aperture in the lateral direction of the alignment pattern of the wafer 2, so that the contrast of the alignment pattern can be increased for its detection.

Figure 4A:
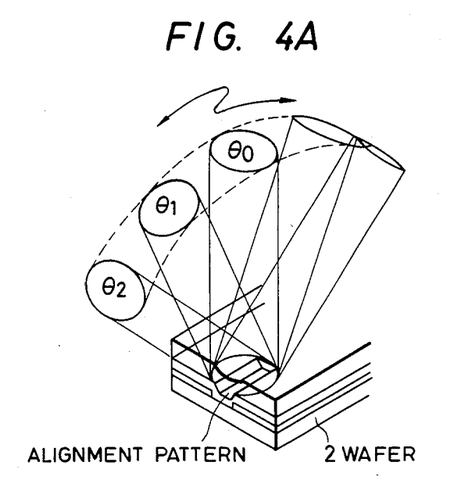
FIG. 4A is an oblique perspective view schematically showing the laser beam used for the irradiation of the wafer.
Figure 4B:
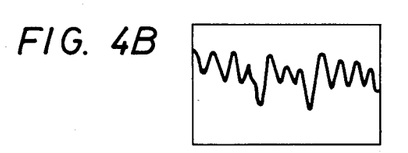
FIGS. 4B, 4C and 4D show the pattern signals when the laser beam is at the three different positions described in FIG. 4A.
Figure 4C:
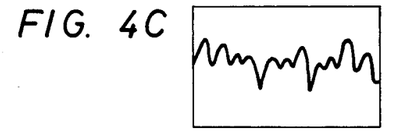
Figure 4D:
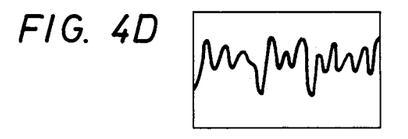
Figure 4E:
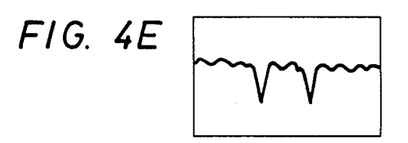
FIG. 4E shows a pattern signal obtained by compounding the pattern signals described respectively in FIGS. 4B, 4C and 4D.

On the other hand, when a surface having fine unevenness such as that of the wafer is illuminated by the coherent light such as the laser beam, the pattern wherein the shade called the speckle pattern varies at random due to the interference with the light diffracted by the uneven surface will be formed. When the incident angle of the light to the surface of the wafer is fixed to $\theta_0$ as shown in FIG. 4A, the signal-to-noise ratio of the pattern signal will be deteriorated as shown in FIG. 4B. When the incident angle is varied to $\theta_1$ and $\theta_2$ and $\theta_0$, the shade of the speckle pattern varies while the shade of the alignment pattern remains constant, and the pattern signal will take the forms as are shown in FIGS. 4C and 4D. Now, the shade of the speckle pattern can be made even by varying the incident angle of the wafer in the longitudinal direction of the pattern and integrating the pattern signals during that period of time, whereby the pattern signal having a better signal-to-noise ratio as is shown in FIG. 4E can be obtained.

The integration of the pattern signals can be accomplished by suspending the read-out and transfer action of the charge coupled device as an image sensor while the incident angle of the illumination light is varying and storing the signal charge in the charge coupled device during this period of time.

Thus, according to this embodiment, the alignment pattern signal having a good signal-to-noise ratio can be obtained by using an illumination light of the laser beam with the incident angle varying in the longitudinal direction of the linear alignment pattern, and this coupled with the aforementioned effect of the detection system can be made to contribute to the improvement in the alignment accuracy.

As has been explained by now, according to the present invention, the pattern detection characteristic of the alignment detection optical system can be controlled independently from the numerical aperture NA of the reduction projection lens, so that the pattern signal having a better signal-to-noise ratio can be obtained, and the alignment accuracy can be improved as a result.

Furthermore, the signal-to-noise ratio of the pattern signal can further be improved by illuminating the alignment pattern of the wafer by a laser beam with its incident angle varying in the longitudinal direction of the alignment pattern of the wafer, whereby the alignment accuracy can further be improved.

Figure 5:
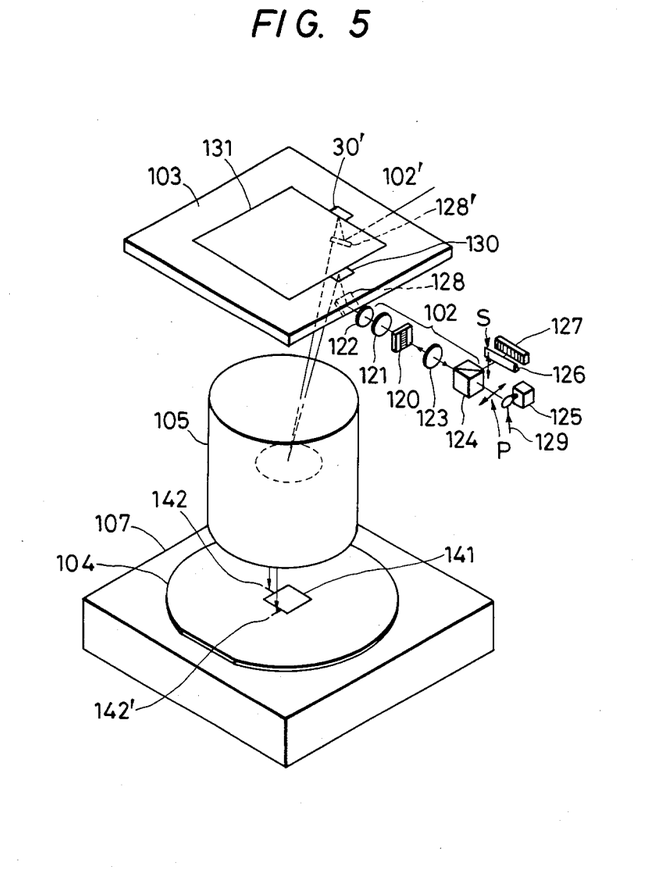
FIG. 5 shows the third embodiment of the present invention.
Figure 6A:
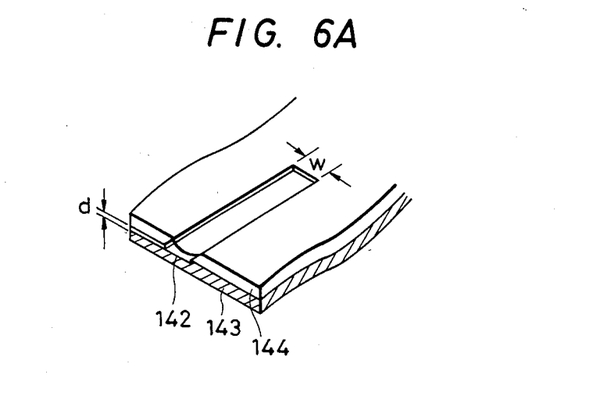
FIGS. 6A, 6B and 6C respectively show the structure of the alignment pattern of the wafer as a subject of observation and the waveform of the alignment pattern detected by the conventional detector.
Figure 6B:
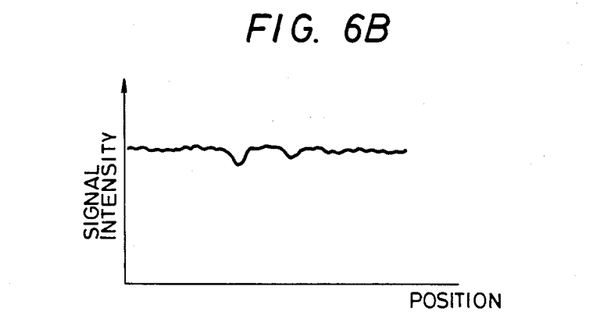
Figure 6C:
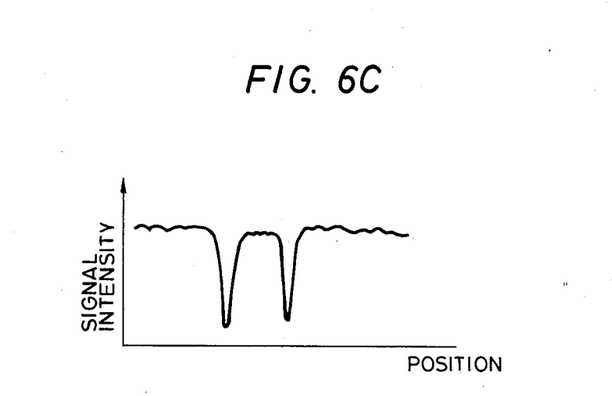
Figure 7A:
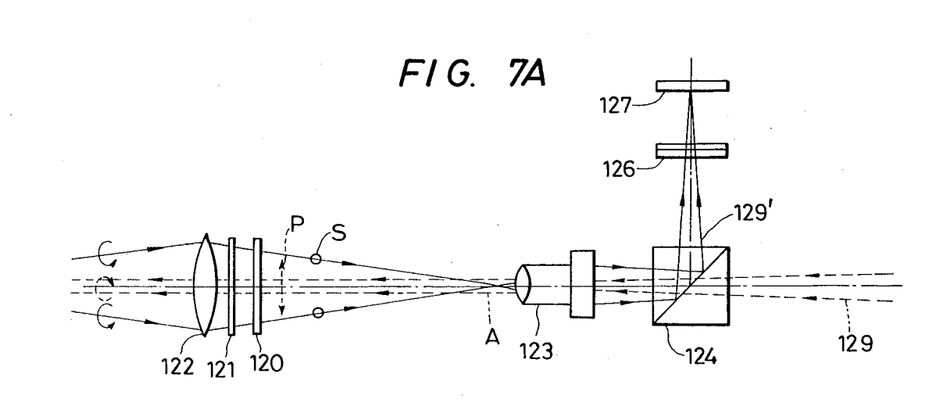
FIGS. 7A, 7B and 7C respectively show the structure of a part which selectively detects the range of the spatial frequency in the case of the embodiment shown in FIG. 5, an example of the deflecting plate used in the embodiment and the waveform detected by the detector used in the embodiment.
Figure 7B:
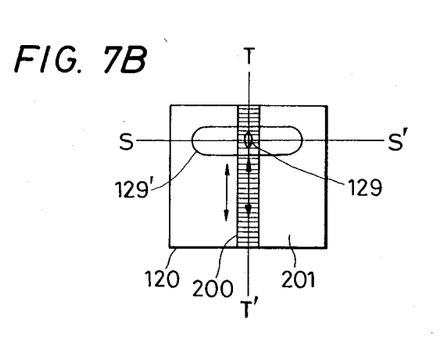
Figure 7C:
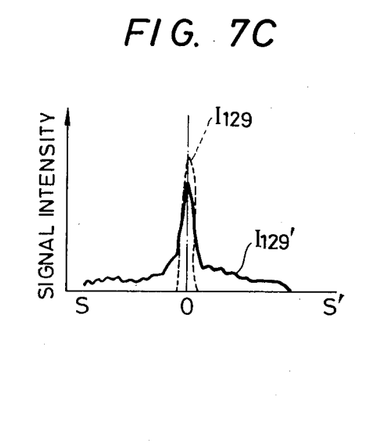
Figure 8A:
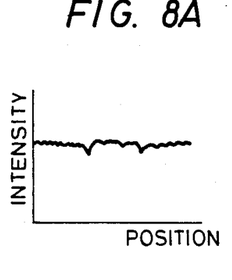
FIGS. 8A, 8B and 8C, FIGS. 9A, 9B and 9C, FIGS. 10A, 10B and 10C, and FIGS. 11A, 11B and 11C respectively show the waveforms detected without using various deflecting plates, various deflecting plates and the waveforms detected using various deflecting plates.
Figure 8B:
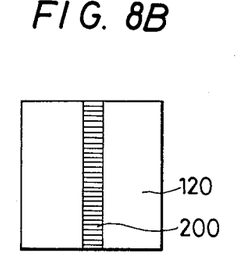
Figure 8C:
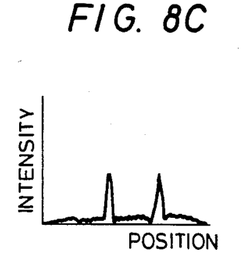
Figure 9A:
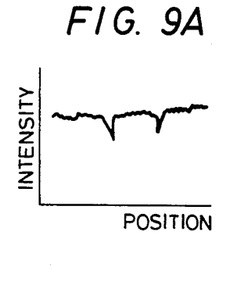
Figure 9B:
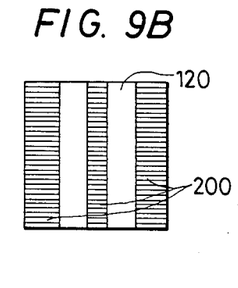
Figure 9C:
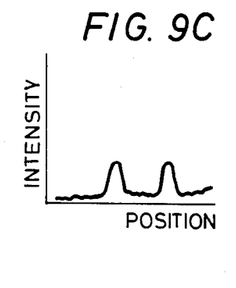
Figure 10A:
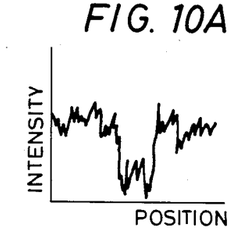
Figure 10B:
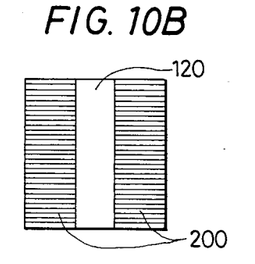
Figure 10C:
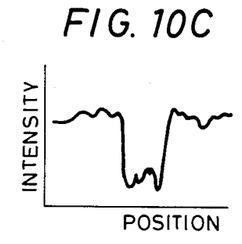
Figure 11A:
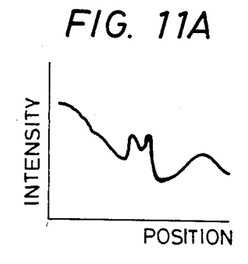
Figure 11B:
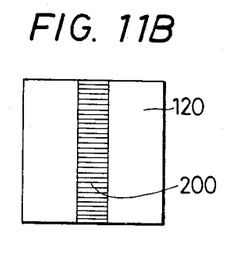
Figure 11C:
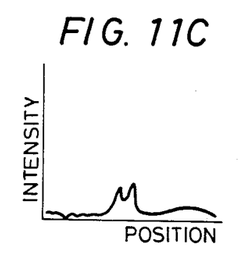

FIG. 5 shows the third embodiment of the present invention. Shown in FIG. 5 are a mask 103 and a pattern 131 disposed on the mask 103 and having a size which is 5 or 10 times that of a circuit pattern to be printed on a wafer. To accomplish the printing of the pattern, the exposure light emitted from an exposure illumination system (not shown) is radiated onto mask from the above, and a chip 141 on a wafer 104 is exposed to the transmitted light reduced by a reduction projection lens 105. The exposure light is used for the superimposed printing of the patterns using a variety of masks, and thus the printing system must be so designed that each pattern can be printed accurately on the specified position on the previously printed pattern. In order to meet this requirement, the present invention can provide a device capable of accurately reading the position of an alignment pattern 142 as a part of the wafer pattern and a subject of the device. The process of the detection in the case of this embodiment will be explained in the following. That is, a laser beam 129 is reflected by a galvanomirror 125, and the laser beam 129 which has passed a polarization prism 124, an imaging lens 123, a polarization plate 120, a quarter wave plate 121 and a relay lens 122 is reflected again by a mirror 128, and a mirror pattern 130 provided adjacent to the circuit pattern of the mask and irradiates the alignment pattern 142 as a subject of examination disposed on the wafer 104 through a reduction lens 105. The reflected light inversely traces the optical path of the illumination light, is reflected by the polarization prism 124, detected by a cylindrical lens 126, compressed in a direction rectangular to the direction in which the picture elements of the image sensor is arranged (the longitudinal direction of the alignment pattern 142 and imaged on a linear sensor 127 (a charge coupled device) which is an image sensor. The mirror surface of the galvanomirror 125 is so disposed that the image is formed on the surface of the wafer through the imaging lens 123, the relay lens 121 and the reduction lens 105. Thus, when the light is deflected using the galvanomirror, the rocking illumination can be realized. A laser beam 129 for the illumination enters as a P polarization light P to the polarization prism. The polarization plate 120 permits the P polarization light P to pass through it, so that the light P polarization P enters into the quarter wave plate 121, and the transmitted light becomes a circular polarization light. The alignment pattern 142 of the wafer is irradiated by the circular polarization light. The reflected light is returned to the quarter wave plate 121 as a circular polarization light and becomes an S polarization light S after passing the quarter wave plate. FIG. 6A shows a cross-sectional view of the alignment pattern 142 of the wafer as is shown in FIG. 5. FIG. 6B shows a conventional detected waveform in the case where the step d is small. Shown in FIG. 6A are substrate 143 of a semiconductor, a photoresist 144 applied on the surface of the substrate and a step d of the alignment pattern of the wafer. Here, the conventional detected waveform means one in the case where the polarization plate 120 is absent. In such case, the step is small, so that the constrast of the edge portion is extremely low compared with that of the pattern with a large step as is shown in FIG. 6C. In the case of such waveform, it is difficult to detect the edge absorbed in the noise, and this causes the frequent occurrence of erroneous detections. As the packing density of the LSI increases, however, the patterns with such low steps increase. Consequently, the further improvement in the detection accuracy will be required. In this embodiment, the polarization plate 120 is provided so that only a part in a high spatial frequency range can be taken out of the reflected light coming from the alignment pattern of the wafer, and the information of the edge portion is taken out selectively, whereby the contrast of the edge signal can be improved. The process for increasing the contrast of said edge signal will be explained in details in the following, by FIGS. 7A, 7B and 7C. FIG. 7A shows the parts of the illumination system and the detection system 102 which are already shown in FIG. 5, and the numbers corresponding to those in FIG. 5 denote the components common to FIG. 7A and FIG. 5. The image (not shown) of the alignment pattern of the wafer formed near the mirror pattern of the mask is reimaged at point A through a relay lens 122. As stated previously, the detected light becomes the S polarization light S where the quarter wave plate 121 is provided immediately after or immediately before (not shown) the relay lens. When a distance f between the reimaging point A and the polarization plate 120 is compared with the size w (the width of the alignment pattern 142 shown in FIG. 6A) of the image of the alignment pattern of the wafer which is formed at point A, in the Fraunhofer field represented by the following formula, the diffraction pattern of the alignment pattern at the position of the polarization plate is almost the Fourier transformation of the distribution of the reimaged light almost at point A.

$$f\lambda >> w^2$$

where $\lambda$ is the wavelength of the light and w=Number $\mu$m. In this case, f is larger than several mm, and the field can be regarded as the Fraunhofer field. The detailed structure of the polarization plate 120 is as shown in FIG. 7B. A polarizer 200 consists of the part close to the central axis through which an alignment pattern illumination light 129 passes, and a diffraction light 129' of the S polarization light returned by being reflected by the alignment pattern of the wafer contains the high-frequency component as is shown in FIG. 7C, but only a desired spatial frequency region is allowed to pass, and the light is shut off at a region 200. Therefore, in the case of the embodiment shown in FIG. 7A, as for the light having passed the polarization plate 120, only the high-frequency component is detected by a detector 127, so that the low-frequency component or the bias component shown in FIG. 6B is removed, and a high-contrast waveform with intensified edge information as is shown in FIG. 8C can be detected. FIGS. 8A, 8B and 8C, FIGS. 9A, 9B and 9C, FIGS. 10A, 10B and 10C, and FIGS. 11A, 11B and 11C respectively show the detailed structure of the polarization plate 120 (see FIGS. 8B, 9B, 10B and 11B) and the conventional waveform without the polarization plate (see FIGS. 8A, 9A, 10A and 11A) compared with the waveform having been changed for easier detection (see FIGS. 8C, 9C, 10C and 11C). The waveform suited for the pattern detection algorithm can be detected where the polarization plate having an optimum form depending on the original waveform (waveform where the polarization plate is absent) can be, for example, mechanically inserted and removed. FIGS. 8A, 9A, 10A and 11A respectively show the detected original waveforms compared with the detected waveforms (see FIGS. 8C, 9C, 10C and 11C) obtained by selecting the spatial frequency in only a specified range (see FIGS. 8B, 9B, 10B and 11B). In this way, the waveform can be adjusted completely by the optical process, and this enables the processing at higher speed or instantaneously with a simpler system compared with the case of the electrical processing.

Figure 12A:
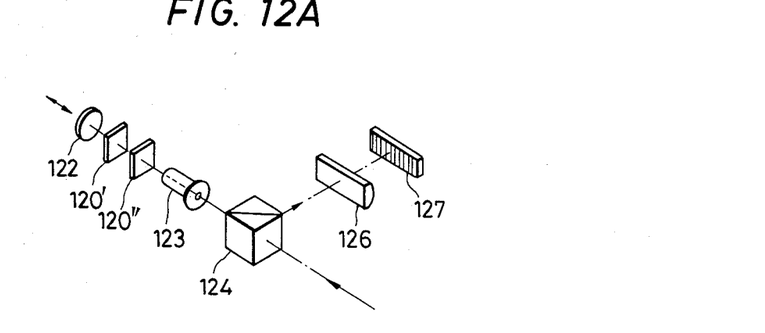
Figure 12B:
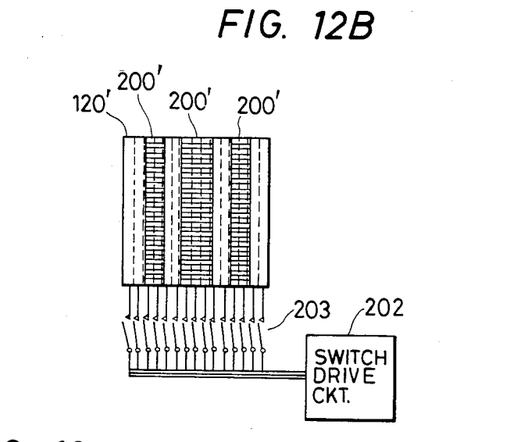
FIG. 12B, shows a special case where the deflection of the ray is varied electrically.

FIGS. 12A and 12B respectively show another embodiment whereby the same function as that of the spatial frequency filter using the polarization plate defined for the embodiment described in FIG. 5. The numbers used commonly in FIGS. 12A and 12B and FIG. 5 denote the same components. In these figures, 120" represents a one eighth wave plate, and the crystal axis is disposed at an angle of 45° to the direction of the polarization of the P polarization light and S polarization light. 120' also represents a one eighth wave plate, and said wave plate consists of an electro-optical crystal and has a structure as is shown in FIG. 12B. That is, said plate is divided into long stripes along its longitudinal direction, and said stripes can be driven independently from each other by a switch drive circuit 202 and a switch group 203 to be driven by said switch drive circuit. When the positive or negative voltage is applied to the stripe, the crystal axis of the strips is reversed, so that, when combined with the one eighth wave plate 120", the part subjected to the positive voltage presents the crystal axis condition which is inverse to that of said plate 120"; the illumination light of the P polarization light having passed said plates 120' and 120" irradiates the alignment pattern of the wafer while maintaining a linear polarization light; and the light returned by having been reflected maintains the P polarization light, so that the light passes the polarization prism 124 and will not reach the image sensor 127. On the other hand, the part subjected to the negative voltage presents the condition of the crystal axis similar to that in the case of the one eighth wave plate 120', so that, when the plates 120' and 120" are combined, it functions as a quarter wave plate; the light entered as a P-degree light becomes a circular polarization light to irradiate the alignment pattern of the wafer; the light returned by having been reflected becomes an S polarization light after having passed the plates 120' and 120"; and the light reflected by the polarization prism 24 and reaches the image sensor. That is, in this embodiment, only a portion of the diffracted light within a certain spatial frequency region can be selectively extracted by varying the polarization condition as in the case of the embodiment described in FIG. 5. In the case of the embodiment shown in FIG. 12A, when the on-off ratio of the polarization prism is not good enough, the filtering of the spatial frequency with higher signal-to-noise ratio can be realized by providing a polarization plate that permits only the transmission of the S polarization light between the polarization prism and the cylindrical lens.

Figure 13:
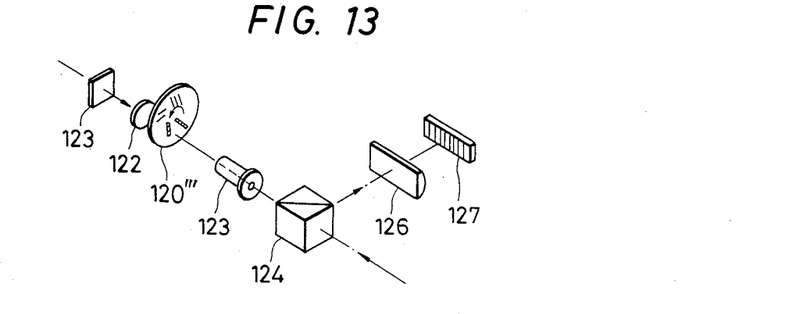
FIG. 13 shows another embodiment of the present invention wherein the form of the pattern of the polarizer is mechanically varied.

FIG. 13 shows another embodiment of the present invention. The numbers common in FIG. 13 and FIG. 5 represent the same components. For instance, 120''' represents a rotary disk with the polarizers of various forms arranged whereon so that the polarizer of the optimum form can be selected and inserted into the optical path depending on the original waveform to be detected.

As explained in the foregoing, according to the present invention, not only the accuracy of the alignment of the exposure system but also the contrast of the image of the micropattern for the semiconductor can be improved, and the information concerning these things can be detected at a higher accuracy.

What is claimed is:

1. An alignment detection optical system which is designed to observe an alignment pattern of a mask and an image of an alignment pattern of a wafer formed on the alignment pattern of the mask by a projection lens in order to make the alignment between the mask and the wafer in a projection type aligner, said detection optical system is provided with a spatial filter disposed at a position which is out of the conjugate relation to said alignment pattern of the wafer and between the image, of said alignment pattern of the wafer and an image sensor for detecting said image and said spatial filter has a transmittivity variable in the lateral direction of said alignment pattern but not variable in the longitudinal direction.

2. An alignment detection optical system defined in claim 1, wherein said spatial filter is a liquid crystal filter.

3. An alignment detection optical system defined in claim 1, wherein said system is further provided with a mirror to deflect the illumination light, the incident angle of incoming illumination light being variable by oscillation of said mirror.

4. An alignment detection optical system defined in claim 1, wherein said spatial filter comprises a polarizer.

5. An alignment detection optical system which is designed for observing an alignment pattern of a mask and an image of an alignment pattern of a wafer formed on the alignment pattern of the mask by a projection lens in order to effect alignment between the mask and the wafer in a projection type aligner, said detection optical system having a polarizer disposed in the Fraunhofer field of the illumination light reflected by said alignment pattern of the wafer and between the image of said alignment pattern of the wafer and an image sensor to detect said image, said polarizer being disposed so that only a part of the diffracted light within a desired spatial frequency range can be selectively detected out of the diffracted light from said alignment pattern.

* * * * *